United States Patent [19]
Ishikawa et al.

[11] Patent Number: 5,661,401
[45] Date of Patent: Aug. 26, 1997

[54] APPARATUS FOR GENERATING CORRECTIVE MAGNETIC FIELD

[75] Inventors: Hiroshige Ishikawa; Jun Kida, both of Tokyo, Japan

[73] Assignee: Jeol Ltd., Tokyo, Japan

[21] Appl. No.: 614,867

[22] Filed: Mar. 13, 1996

[30] Foreign Application Priority Data

Mar. 13, 1995 [JP] Japan .................................. 7-052504

[51] Int. Cl.$^6$ .................................................. G01V 3/00
[52] U.S. Cl. .................................. 324/320; 324/319
[58] Field of Search ........................ 324/320, 318, 324/322, 319, 307, 309; 335/299, 296

[56] References Cited

U.S. PATENT DOCUMENTS

| | | | |
|---|---|---|---|
| 4,680,551 | 7/1987 | O'Donnell et al. | 324/320 |
| 4,949,043 | 8/1990 | Hillenbrand et al. | 324/320 |
| 5,006,804 | 4/1991 | Dorri et al. | 324/320 |

*Primary Examiner*—Louis M. Arana
*Attorney, Agent, or Firm*—Webb Ziesenheim Bruening Logsdon Orkin & Hanson, P.C.

[57] ABSTRACT

An apparatus for generating a corrective magnetic field in a nuclear magnetic resonance (NMR) spectrometer. The apparatus has saddle-type, spirally wound coils whose number is in excess of the number of controlled magnetic field components. Each coil is made to produce plural magnetic field components. The coils of a simple shape are combined to correct axial magnetic field components and rotation direction magnetic field components. Electrical currents supplied to the coils are controlled so as to minimize the total amount of heat generated by all the coils. The center of each coil lies on the z-axis. The coils are stacked on top of each other along the z-axis and arranged symmetrically with respect to the z-axis. One power supply is connected to each one coil. Since the number of the coils is greater than the number of controlled magnetic field components, other arbitrary conditions are added, as well as the controlled magnetic field-components, in determining the currents. Among these conditions, it is important that the total amount of heat generated by the coils be reduced to a minimum. Lagrangian multipliers are used for this purpose. The power supplies are informed of the determined current values.

20 Claims, 5 Drawing Sheets

FIG. 9E

# APPARATUS FOR GENERATING CORRECTIVE MAGNETIC FIELD

FIELD OF THE INVENTION

The present invention relates to a corrective magnetic field-generating apparatus adapted for use with an instrument which is required to have a high magnetic field uniformity such as a nuclear magnetic resonance spectrometer.

BACKGROUND OF THE INVENTION

In NMR (nuclear magnetic resonance), a superconducting magnet is utilized to produce a magnetic field. The uniformity of the magnetic field is only between about $1.0\times10^{-5}$ to $1.0\times10^{-6}$ at best. However, in recent years, magnetic fields of quite high uniformities of $1.3\times10^{-9}$ to $1.0\times10^{-10}$ have been required. Accordingly, it is common practice to provide a corrective magnetic field-generating apparatus for compensating for magnetic field nonuniformities.

Some technical terms used herein are defined below. First, elements for producing a corrective magnetic field are referred to as shims. A set of coils energized with an electrical current to provide a magnetic field correction is referred to as an electrical current shim. A shim which is disposed near the center of a magnet for producing a principal magnetic field and which operates at room temperature is referred to as a room-temperature shim. The present invention especially relates to a room-temperature shim and so a room-temperature shim may be simply referred to as a shim hereinafter.

Figure 6:
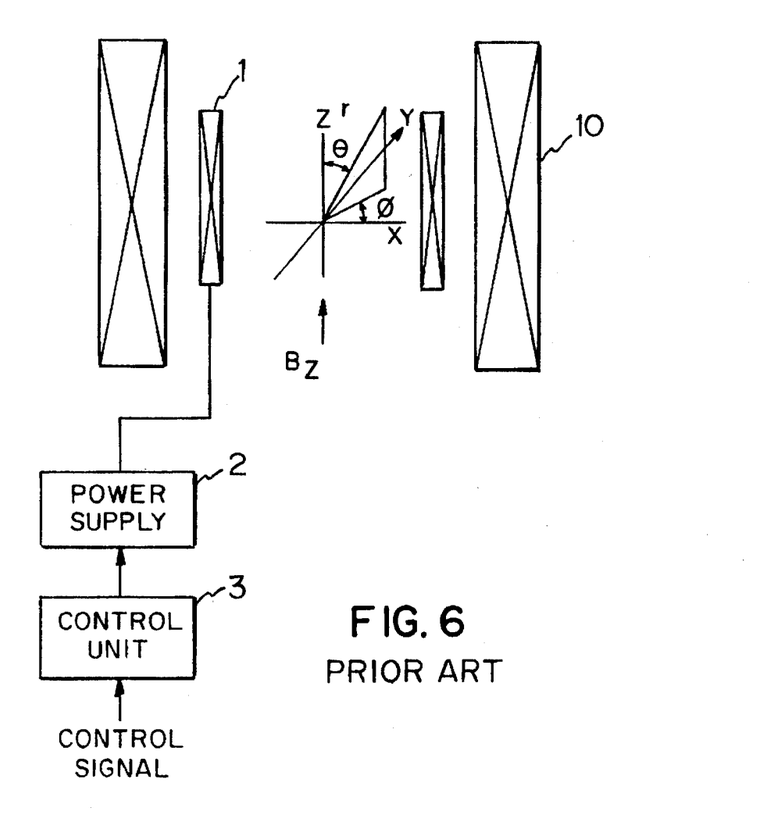
FIG. 6 is a diagram of a shim according to the invention.

Referring to FIG. 6, a corrective magnetic field-generating apparatus is normally composed of a shim 1, a power supply 2 for supplying an electrical current to the shim, and a control unit 3 for controlling the power supply according to information given from the outside. This corrective magnetic field-generating apparatus produces a corrective magnetic field to cancel out nonuniform components of the principal magnetic field or to vary the uniform magnetic field. The principal magnetic field is set up by a magnet 10 which is a superconducting magnet having superconducting solenoid coils in NMR.

The present invention is directed to a region around the center of the magnet 10 producing the principal magnetic field. In FIG. 6, the center of the magnet 10 is taken at the origin. The center axis is taken on the z-axis. The x- and y-axes to lie on a plane orthogonal to the z-axis. Let r, Θ (theta), and φ (phi) be three components of a polar coordinate system. It is known that the z-axis component $B_z$ of the magnetic field near the origin in the magnet 10 is given by $$B_Z(r,\Theta,\phi) = A_0 + \sum_{n=1}^{\infty} A_n r^n P_n(\cos\Theta) + \qquad (1)$$

$$\sum_{n=1}^{\infty} \sum_{m=1}^{n} [r^n P_n^m(\cos\Theta)(A_n^m \cos m\phi + B_n^m \sin m\phi)]$$

Generally, in the center of a magnet of high uniformity, the x-axis and y-axis components of the magnetic field are sufficiently smaller than the z-axis component and thus can be neglected. Therefore, only the z-axis component $B_z$ of the magnetic field is considered in the following discussion.

In Eq. (1) above, $A_0$ indicates the magnitude of a uniform magnetic field component. The other components indicate the magnitudes of nonuniform magnetic field components. Indicated by n and m are integers not less than 0. $A_n^m$ and $B_n^m$ are constants. $P_n^m(\cos\Theta)$ is an associated Legendre function. Where m=0, m will be omitted hereinafter. For example, $A_1^0$ is simply referred to as $A_1$, and $P_n^0(\cos\Theta)$ is simply referred to as $P_n(\cos\Theta)$.

A magnetic field assuming a value independent of φ shown in FIG. 6 within a plane perpendicular to the z-axis is herein referred to as an axial magnetic field. A magnetic field taking a value dependent on φ is referred to as a rotation direction magnetic field. In Eq. (1), the first and second terms with m=0 and not dependent on φ indicate axial magnetic field components. The third term with m≠0 and dependent on φ indicates rotation direction magnetic field components.

The x-axis and y-axes are rotated around the z-axis through angles of $(2\pi/M)\times k$ (M=2, 3, 4, ... ; for each value of M, k=1, ..., M−1). As a result, those magnetic fields which appear exactly the same as the magnetic field not rotated at all, i.e., k=0, exist. These magnetic fields are referred to as M-times-rotation-symmetric magnetic fields or simply as rotation-symmetric magnetic fields.

Magnetic field components corresponding to the constants $A_n^m$ and $B_n^m$ of the z-axis magnetic field components which can be expressed by Eq. (1) are referred to as the $A_n^m$ and $B_n^m$ components of the magnetic field or simply as $A_n^m$ and $B_n^m$. Where A, B, and m are different the magnetic field components are different in dependence on angle. Therefore, the constants $A_n^m$ and $B_n^m$ are magnetic field components which are different in dependence on angle. $A_n^m$ and $A_k^m$ (n≠k) are magnetic field components which have the same dependence on angle.

Those components of the z-axis magnetic field component produced by a shim which are intentionally controlled are referred to as controlled magnetic field components. Of these controlled magnetic field components, magnetic field components used to vary uniform field components and to compensate for nonuniform field components are referred to as corrective magnetic field components.

Accordingly, "corrections of magnetic field" encompass variations of uniform field components, as well as corrections of nonuniform field components.

A conventional configuration of the corrective field-generating apparatus shown in FIG. 6 is described in U.S. Pat. No. 3,287,630. This apparatus comprises four groups of coils (Z' coils, $Z_1"$ coils, $Z_2"$ coils and Z''' coils) for correcting axial magnetic field components and four groups of coils (X coils, Y coils, X-Z coils, and Y-Z coils) for correcting rotation direction field components.

Each group of coils consists of one or more pairs of coils connected in series. Each group produces one corrective magnetic field component. A shim consisting of such series combination or combinations of coils is referred to as a series shim herein.

The corrective magnetic field component produced by the series shim is determined by the positions of the coils, their shape, the directions of electrical currents, and the number of turns. As a consequence, the structure of the shim is complicated. Also, the coils have to be designed with a very limited number of degrees of freedom. It is difficult to reduce the heat produced by the coils by reducing the energizing current. In this way, various problems exist.

SUMMARY OF THE INVENTION

In view of the foregoing problems, the present invention has been made.

It is an object of the invention to provide a corrective magnetic field-generating apparatus which has a relatively simple structure and is capable of compensating for axial magnetic field components and/or rotation direction magnetic field components.

It is another object of the invention to provide a corrective magnetic field-generating apparatus comprising coils which can be designed with a greater number of degrees of freedom than conventional, are energized with a less amount of electrical current, and permit the heat generated by the coils to be reduced easily.

A corrective magnetic field-generating apparatus according to the present invention comprises coils, power supplies, and a control means. The coils are disposed along a cylindrical plane that is centered at the z-axis along which a principal magnetic field is produced. The number of the coils is in excess of the number of magnetic field components to be controlled. One power supply is provided for each one coil. Each coil is independently energized, i.e., supplied with a different electrical current. The control means determines the electrical currents supplied to the coils, depending on the conditions of the magnetic field components to be controlled and also on other selected conditions.

Preferably, one of the selected conditions is that the total amount of heat generated by the coils is reduced to a minimum. It is desired that the control means use Lagrangian multipliers, also known as undetermined multipliers, in which an arbitrary weight is assigned to each electrical current, as a method for determining the currents supplied to the coils.

Another corrective magnetic field-generating apparatus according to the invention also comprises coils, power supplies, and a control means. The coils are arranged along a cylindrical plane that is centered at the z-axis along which a principal magnetic field is produced. Each one coil contributes to corrections of a plurality of rotation direction magnetic field components. One power supply is provided for each one coil. Each coil is independently energized.

The control means determines the currents supplied to the coils according to the conditions of controlled magnetic field components by means of matrix algebra.

Since the invention is configured as described above, the shapes of the coils can be simplified. The efficiency at which the corrective magnetic field is developed can be enhanced. Furthermore, the amount of heat generated can be reduced. These effects become more conspicuous where one coil contributes to corrections of plural rotation direction magnetic field components having different dependence on angle.

In addition, where one coil contributes to corrections of plural axial magnetic field components and also to corrections of rotation direction magnetic field components, the corrective magnetic field is produced at a much higher efficiency than in the case where correction of the axial magnetic field components is made independent of correction of rotation direction magnetic field components.

Other objects and features of the invention will appear in the course of the description thereof, which follows.

Figure 7:
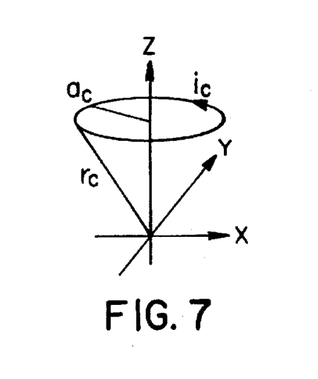
FIG. 7 is a diagram illustrating an annular coil.

DETAILED DESCRIPTION OF THE INVENTION (A) Correction of Axial Magnetic Field Components Essentially, annular coils constructed as shown in FIG. 7 are used to compensate for axial magnetic field components. Let $z_c$ be the center position of the annular coil shown in FIG. 7. Let $a_c$ be the radius of the coil. Let $i_c$ be the current flowing through the coil. Let $r_c$ be the distance between the origin and the annular coil. The z-axis magnetic field component $B_z$ around the center of the field produced by the annular coil is given by $$B_z(r,\Theta) = i_c(A_0(z_c, a_c) + A_1(z_c, a_c)\, r\, P_1(\cos\Theta) + A_2(z_c, a_c)\, r^2\, P_2(\cos\Theta) + \ldots) \quad (2)$$

where $A_n(z_c, a_c)$ indicates the magnitude of the n-th order magnetic field component. This is further described below. Let $\mu_0$ be the vacuum permeability. Assuming that n=0, 1, 2, ..., we have $$A_0(z_c, a_c) = (\mu_0/2) \times (a_c^2/r_c^3) \quad (3)$$

$$A_n(z_c, a_c) = (\mu_0 a_c/2) \times (P_{n+1}^1(x)/r_c^{n+2}) \quad (4)$$

where $x = z_c/r_c$. Also, we have $$r_c^2 = z_c^2 + a_c^2 \quad (5)$$

If n is even, $A_n$ is an even function for $z_c$. If n is odd, then $A_n$ is an odd function for $z_c$.

Figure 8A:
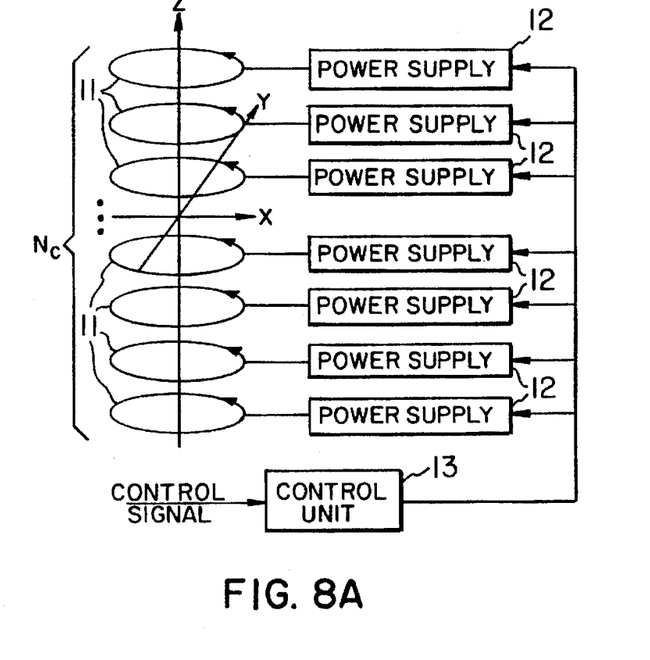
FIG. 8A is a diagram illustrating correction of axial magnetic field components, using annular coils.

FIG. 8A shows a corrective magnetic field-generating apparatus according to the invention. This apparatus comprises $N_c$ coils 11, power supplies 12 capable of independently energizing the coils, and a control unit 13 for controlling the power supplies. Magnetic field components produced by these $N_c$ coils are combined to correct nonuniform magnetic field components. First, the case in which the number of coils is equal to the number of controlled magnetic fields is described. In this case, electrical currents are determined, using matrix algebra.

Figure 8B:
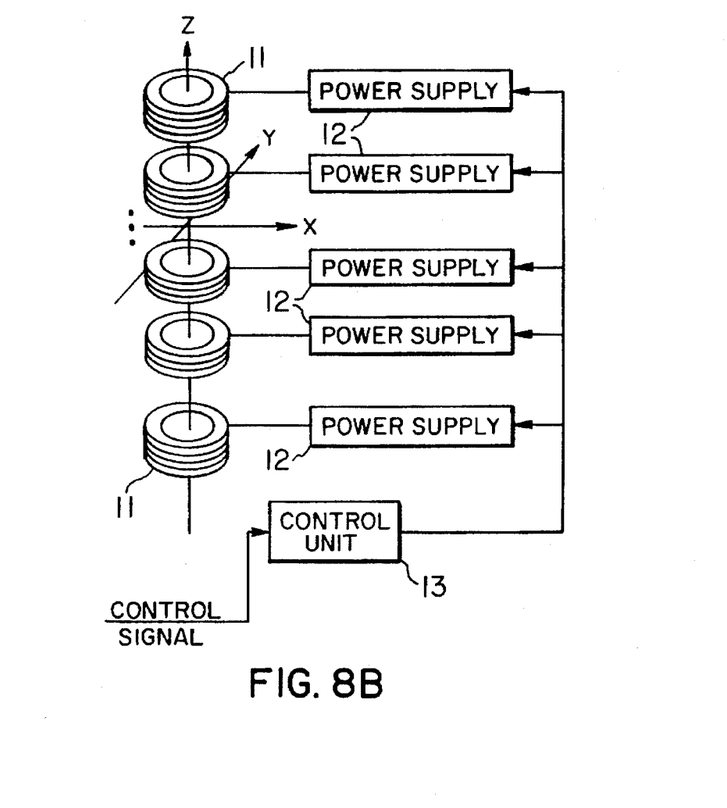
FIG. 8B is a diagram similar to FIG. 8A, but in which a lap-wound solenoid coil is used instead of the annular coils.

A shim comprising coils whose number is equal to the number of controlled magnetic field components and which are supplied with electrical currents determined, using matrix algebra, is referred to as a matrix shim. In FIG. 8A, electrical currents are shown to flow in the same sense through the coils. In practice, the senses of currents flowing through the coils are not the same. The annular coils shown in FIG. 8A can be replaced by a lap-wound solenoid coil having a width as shown in FIG. 8B.

In FIG. 8A, the $N_c$ annular coils are centered at the z-axis. Since Eqs. (1) and (2) can be expanded with the same functions, if these functions are applied to basic functions, the relation of currents flowing through the coils to the sum $c_k$ of the k-th order controlled magnetic field components produced by the coil assembly can be expressed, using matrices as follows.

$$c = Fi \quad (6)$$

$$c = [c_k] \quad (7)$$

$$F = [f_{kl}] \quad (8)$$

$$i = [i_l] \quad (9)$$

where $k = 0, 1, 2, \ldots, N_{c-1}$, $l = 0, 1, 2, \ldots, N_{c-1}$, $c_k$ is the sum of the k-th order controlled magnetic field components produced by all the coils, $f_{kl}$ is the $A_k$ component of the l-th coil, and $i_l$ is the current flowing through the l-th coil. $[a_{kl}]$ means a matrix. $[b_k]$ means a column vector. Their magnitudes are specified within the ranges of the subscripts.

$$[a_{kl}] = \begin{bmatrix} a_{00} & \cdots & a_{0,N_c-1} \\ \vdots & \ddots & \vdots \\ a_{N_c-1,0} & \cdots & a_{N_c-1,N_c-1} \end{bmatrix}$$

$$[b_k] = \begin{bmatrix} b_0 \\ \vdots \\ b_{N_c-1} \end{bmatrix}$$

The coils are ordered appropriately. The same principle applies to the following description. To make the magnetic field uniform, the following relations are established:

$c_0 = -\{(\text{uniform component value of Eq. (1)}) - (\text{uniform component value to be established})\}$ (10)

$c_k = -(\text{nonuniform component value of } A_k \text{ component of Eq. (1)})$ where $k \neq 0 + tm$ (10')

Eq. (10) holds where $k = 0$. Eq. (10') holds where $k \neq 0$.

Eq. (6) is solved, and the currents to be supplied to the coils are found. Then, the currents are supplied to the coils. As a result, the nonuniform component of Eq. (1) and the corrective component of Eq. (6) are combined. Consequently, the magnitudes of the nonuniform magnetic field components can be brought to zero up to the $(N_c-1)$th order. Alternatively, the uniform magnetic field components can be set to desired values. However, with respect to uncorrected magnetic field components, Eq. (6) can be solved under the condition $c_k = 0$.

Also in the following description, the control unit 13 shown in FIGS. 8A and 8B is informed of the controlled magnetic field c given by Eq. (6) so that uniform components are set to a desired value, and that nonuniform components are brought to zero. In this way, the magnetic field can be corrected. Therefore, only a method of generating controlled magnetic field components and a method of determining the currents will be described below.

In an NMR spectrometer, a probe inserted into the principal magnetic field produced by a superconducting magnet is very closely spaced from the magnet. This limits the space where shim coils can be installed.

Where currents supplied to shim coils are large, the power supplies are made large. In addition, the shim coils produce heat, thus elevating the temperature of the sample with undesirable results.

Moreover, NMR spectrometers have been required to produce magnetic fields of high uniformity in recent years. Hence, it has been required to compensate for higher-order magnetic field components. In practice, it has sufficed to compensate for about 20 magnetic field components at most. In recent years, it has been necessary to correct for more than 40 magnetic field components.

Accordingly, the following conditions, for example, are imposed in designing the shim.

(a) There are sufficient number of controlled terms.

(b) It is possible to install coils in a narrow space.

(c) Currents produce a small amount of error. Also, windings produce a small amount of error. Furthermore, the created errors produce the least undesirable results.

(d) Electrical currents supplied to shim coils are small.

(e) The shim coils produce only a small amount of heat.

(f) The kinds of the power supplies are few. If possible, only one kind of power supply exists.

(g) It is easy to assemble the shim.

(h) The cost of the shim is low.

It is well known that the amount of heat generated by the coils producing the same magnetic field component can be effectively reduced by increasing the number of turns on each coil. Where the volume occupied by the winding is constant, it is equivalent to increase of the winding density.

It is assumed that the cross-sectional area of the conductor forming a coil is constant. Letting $B_n$ be the n-th order magnetic field output, N be the number of turns, I be the electrical current, W be the amount of heat generated, and R be the resistance, we have $$B_n \propto N \times I$$

$$W = R \times I^2 \quad (16)$$

$$R \propto N$$

Therefore, we get $$W \propto B_n^2 / N \quad (17)$$

$T_n(z_r, a_r)$ contained in Eq. (12) is given by $$T_n(z_r, a_r) \propto a_r / (z_r^2 + z_r^2)^{(n+2)/2} \quad (18)$$

As the electrical current goes away from the origin, a smaller value is obtained. Also, as the order n increases, the value decreases. The same tendency is developed about $T_n^m$ (described later) under the condition $m \neq 0$.

The aforementioned conditions (a)–(h) are now discussed. In the configuration shown in FIG. 8B, the power supply connected to a coil disposed remotely from the center (x-y plane) might be required to develop a higher voltage than the voltage developed by the power supply connected to a coil disposed close to the center. In this case, coils disposed remotely from the center are split into plural parts, thus lowering the resistance value. This permits use of lower-voltage power supplies. In this manner, the condition (f) imposed when the shim is designed is satisfied.

If the supplied current is determined according to Eq. (6) above, then it is necessary to control the same number of magnetic field components as the power supplies. This increases the number of conditions and currents to be supplied to coils. Especially, if higher-order magnetic field components are introduced, currents are increased, thus increasing the amount of heat generated. In order to avoid these undesirable situations, it is necessary to find the solution of Eq. (6) without increasing the number of the controlled magnetic field components. Exactly the same requirement must be met where rotation direction magnetic field components are corrected as described later. As the number of coils increases, this requirement must be satisfied more strictly.

In the apparatus shown in FIGS. 8A or 8B, it is assumed that the number of coils is greater than the number of controlled magnetic field components. If the number of coils is increased without increasing the controlled magnetic field components, then in the matrix F in Eq. (6), the number of columns is greater than the number of rows. Therefore, it is impossible to determine a single solution. Accordingly, the present invention is characterized in that we do not take notice of only the magnetic field components as described above but rather solutions are determined, using restricting conditions other than magnetic field components.

Any desired conditions can be used. To take an example, conditions which minimize the amount of heat Q generated by the shim are used. Where more shim coils than the controlled magnetic field components are employed, the coils can be designed with greater degrees of freedom. For instance, the shapes and the positions of the coils can be determined with greater degrees of freedom. As a result, the restricting conditions imposed when the shim is designed can be satisfied more easily. This effect appears more conspicuously where rotation direction magnetic field components are corrected as described later. In brief, conditions to be found are as follows.

$$c = Fi \quad (19)$$

$$Q = {}^{t}iRi \quad (20)$$

$$c = [c_k] \quad (21)$$

$$F = [f_{kl}] \quad (22)$$

$$i = [i_l] \quad (23)$$

$$R = [R_{ll}] \quad (24)$$

where ${}^{t}i$ is a transpose of $i$, $R_{ll}$ is the resistance of the l-th coil, $c_k$ is the sum of the controlled magnetic field components of $A_k$ of all the coils, $f_{kl}$ is the controlled magnetic field components of the $A_k$ of the l-th coil, and $i_l$ is the current flowing through the l-th coil. A matrix having equal subscripts such as $[R_{ll}]$ expresses a diagonal matrix and is given by $$[R_{ll}] = \begin{bmatrix} R & & 0 \\ & \ddots & \\ 0 & & R_{N_c-1,N_c-1} \end{bmatrix}$$

Also, we have relations $$k = 0, 1, 2, \ldots, (n_s - 1)$$

$$l = 0, 1, 2, \ldots, (N_c - 1)$$

where $n_s$ is the number of controlled axial magnetic field components and $N_c$ is the number of coils. The conditions which minimize the amount of heat Q produced by the shim reduce the value of Eq. (20) to a minimum.

Accordingly, Eq. (19) is solved under the condition that the amount of heat Q produced by the shim is reduced to a minimum. Lagrangian multipliers can be used as a method of finding solutions. In particular, the solutions are derived as the following equation:

$$i = inv(R) \, {}^{t}F \, inv(F \, inv(R) \, {}^{t}F) \, c \quad (25)$$

where ${}^{t}F$ indicates the transpose of F and $inv(R)$ indicates the inverse matrix of a matrix R. These conventions also apply to the following description.

The portion of the right hand of Eq. (25) excluding c can be found independent of c. This portion is previously found by calculation and stored in the control unit. A human operator sets the c to a desired value and enters it. Then, the control unit is caused to calculate Eq. (25). In this way, the electrical current value supplied to each coil can be found. After the control unit informs the power supplies 12 of the found values of the currents supplied to the coils, the power supplies supply the currents to their respective coils.

It is also possible to consider that the $R_k$ in Eq. (20) is the weight assigned to each current. Hence, $R_k$ may be adjusted at will. Specifically, the squares of electrical currents are multiplied by an appropriate value, and their products are summed up. The currents supplied to the coils of the shim, or the corrective magnetic field-generating apparatus, are so determined that the sum is reduced to a minimum. This shim resembles the matrix shim in that matrix algebra is used. However, since the solutions of the currents are found, using Lagrangian multipliers, the shim is referred to as a Lagrangian shim herein.

With the Lagrangian shim, controlled magnetic field components can be selected according to varying conditions. For example, in the case of an NMR spectrometer, the controlled magnetic field components can be automatically selected, depending on the length of the sample and the kind of the probe.

In this Lagrangian shim, if the number of controlled field components $$\leq \text{the number of shim coils} \quad (26)$$

then, the solutions of Eq. (19) can be found. In other words, the number of the controlled magnetic field components can be reduced to permit desired solutions to be derived.

Calculation of Eq. (25) is executed by the control unit and so F in Eq. (19) can be easily modified. Where the space in which corrections are provided in short in the z-direction, or where a very high degree of uniformity is not required, low-order magnetic field components can be selected up to an appropriate order. In this way, the amount of heat generated can be reduced.

Furthermore, where it is not necessary to control high-order terms, the present invention makes it possible to produce more low-order terms with the same configuration.

Additionally, if any power supply or coil is damaged, it is possible to compensate for the magnetic field within the range satisfying the conditions of Eq. (26) without using the damaged power supply or coil and without reducing the number of the controlled magnetic field components.

(B) Correction 1 of Rotation Direction Magnetic Field Components

Figure 9A:
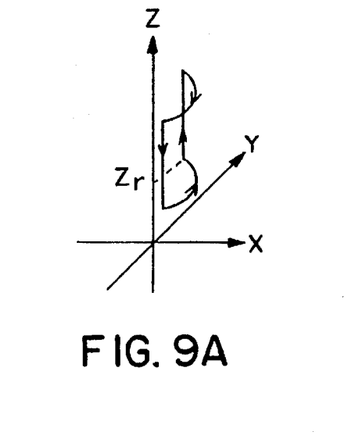
FIGS. 9A–9E are diagrams illustrating correction of rotation direction magnetic field components, using saddle-type coils.

Correction of rotational direction magnetic field components is next described. It is common practice to use arcuate coils using parts of annular coils centered at the z-axis in order to correct rotation direction magnetic field components. An example of this is shown in FIG. 9A, where two electrical currents of the same magnitude flow in arcuate paths. These currents are hereinafter referred to as arcuate currents. These two arcuate currents are coupled to each other by two electrical currents parallel to the z-axis, thus forming a closed loop. In this way, a saddle-type coil is formed. Only the arcuate portions produce z-axis magnetic field components. Arcuate portions remotely spaced from the x-y plane with z=0 may sometimes be neglected.

Figure 9B:
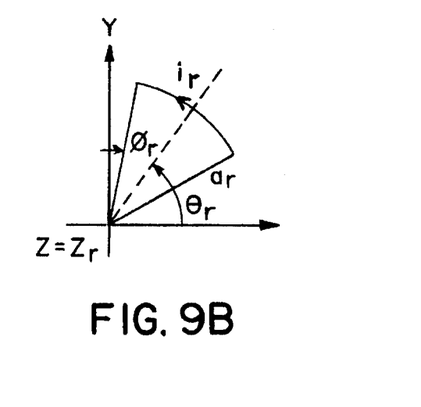

Referring to FIG. 9B, let $z_r$ be the position of an arcuate current on the z-axis. Let $a_r$ be the radius. Let $i_r$ be the current flowing through the coil portion. Let $\Theta_r$ be the center angle. Let $\Theta_r$ be the aperture angle. The z-axis components of the magnetic field $B_z$ near the center of the field produced by the arcuate current is given by $$B_z(r,\Theta,\phi) = i_r \left\{ A_0(z_r,a_r) + \sum_{n=1}^{\infty} A_n(z_r,a_r) r^n P_n(\cos\Theta) + \right.$$

$$\sum_{n=1}^{\infty} \sum_{m=1}^{n} [r^n P_n^m(\cos\Theta)(A_n^m(z_r,a_r,\Theta_r,\psi_r)\cos m\phi +$$

$$\left. (B_n^m(z_r,a_r,\Theta_r,\psi_r)\sin m\phi)]\right\} \quad (11)$$

Figure 9C:
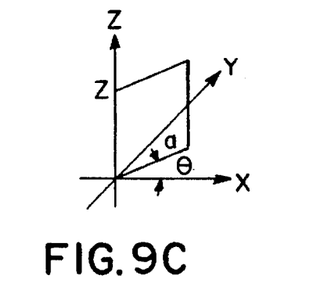

The arcuate current is expressed in terms of the system of cylindrical coordinates (a, $\Theta$, z) shown in FIG. 9C. $A_n^m(z_r, a_r)$ and $B_n^m(z_r, a_r)$ indicate the magnitudes of the (n, m)th orders. Details of these equations are not described below. For simplicity, only those which are necessary for description of the present invention are described.

$$A_n(z_r, a_r) = T_n(z_r, a_r) \psi_r \quad (m=0) \quad (12)$$

$$A_n^m(z_r, a_r, \Theta_r, \psi_r) = T_n^m(z_r, a_r) \sin(m\psi_r) \cos(m\Theta_r) \quad (m \neq 0) \quad (13)$$

$$B_n^m(z_r, \Theta_r, \psi_r) = T_n^m(z_r, a_r) \sin(m\psi_r) \sin(m\Theta_r) \quad (m \neq 0) \quad (14)$$

where $T_n^m(z_r, a_r)$ is a function of $z_r$ and $a_r$. It is to be noted that $^0$ in $T_n^0$ is omitted. This contains constants such as $\mu_0$.

In this way, each magnetic field component can be divided into functions of $(z_r, a_r)$, $\psi_r$, and $\Theta_r$. The aperture angle $\psi_r$ is set to half of the angle subtended by the arcuate coil portion. Therefore, the aperture angle of the annular coil is $\pi$.

If (n−m) is even (n, m=0, 1, 2, ...), the $A_n^m$ and $B_n^m$ are even functions with respect to $z_r$. If (n −m) is odd, they are odd functions with respect to $z_r$.

The above-cited U.S. Pat. No. 3,287,630 discloses a technique for arranging shims each producing a corrective magnetic field component corresponding to each (n, m) of the $A_n^m$ and $B_n^m$ in order to compensate for the rotation direction magnetic field components given by Eq. (1). This is a series shim. In this case, coils normally form an assemblage of saddle-type coils to create a closed loop of electrical current.

Figure 9D:
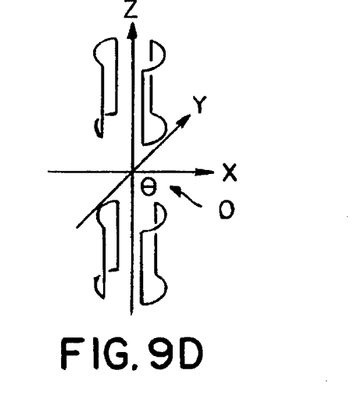
Figure 9E:
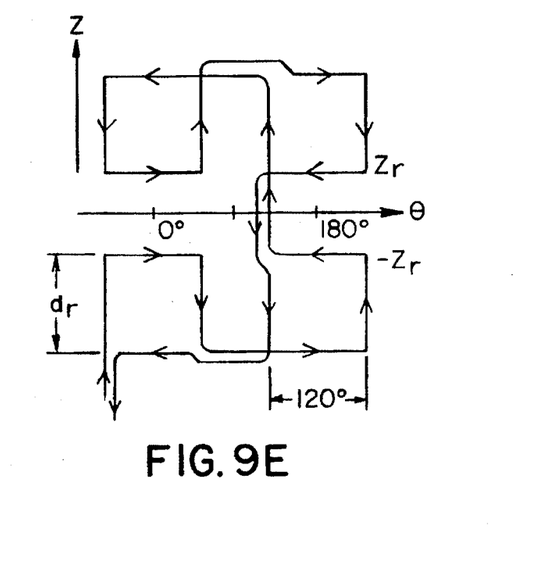

For example, a shim coil for producing $A_1^1$ component consists of a series combination of four saddle-shaped portions symmetrically arranged with respect to the z-axis and the z-plane, as shown in FIG. 9D. If arcuate portions remotely spaced from the x-y plane with z=0 are disposed sufficiently remotely, then these arcuate portions can be neglected. FIG. 9E is a developed view of the four coil portions shown in FIG. 9D.

At this time, the position and the shape of the $A_1^1$ shim coil and the electrical current flowing through it are expressed as follows:

$$(z_r, a_r, \Theta_r, \phi_r, d_r, i) = (z_{r0}, a_{r0}, 0, \pi/3, d_{r0}, i_0) \text{ (first portion)} \quad (15)$$

$$(z_{r0}, a_{r0}, \pi, \pi/3, d_{r0}, -i_0) \text{ (second portion)}$$

$$(-z_{r0}, a_{r0}, 0, \pi/3, d_{r0}, i_0) \text{ (third portion)}$$

$$(-z_{r0}, a_{r0}, \pi, \pi/3, d_{r0}, -i_0) \text{ (fourth portion)}$$

where $z_{r0}$, $a_{r0}$, $d_{r0}$, and $i_0$ are constants indicating the position and the shape of each coil portion, the current flowing through it, and the coil, respectively. In the above equation, $(z_r, a_r, \Theta_r, \phi_r, d_r, i)$ indicate the z-coordinate of the arcuate portion of one saddle-type portion close to the z-plane, the radius, the center angle, the aperture angle, the distance between the two arcuate portions taken along the z-axis, and the current, in this order. The positive and negative signs attached to the final term $i_0$ indicate that the electrical currents flowing through the first and third portions are opposite in sense to the electrical currents flowing through the second and fourth portions.

The mechanism by which a corrective magnetic field is produced by the coil is next described. At this time every value of $T_n^m(z_r, z_r)$ is equal within the same plane perpendicular to the z-axis. Therefore, the following relations hold:

I. If the relation $\Theta_r=0$ or $\pi$ is established, then $\sin(m\Theta_r)=0$. Therefore, $B_n^m$ is not produced. This is referred to as selection according to the center angle.

II. Since the electrical currents flowing in the positive and negative directions are equal on the same plane, if m is even, then $\cos(2k\times 0)-\cos(2k\times\pi)=0$. Therefore, none of the components m=0, 2, 4, ..., are produced (m=2k). This is referred to as selection according to symmetry of electrical currents in the direction of rotation.

III. As a result of I and II, only the components of $A_n^m$ (m=1, 3, 5, 7, ...) are produced. However, since $\psi_r=\pi/3$, the relationship $\sin(3\times\pi/3)=0$ holds. Hence, $A_n^3$ component is not produced. This is referred to as selection according to the aperture angle.

IV. Accordingly, electrical currents are supplied in a vertically symmetrical relation to produce only the components of (n−m)=0, 2, 4, ... Then, $zr_o$ is selected to be at the position $A_3^1=0$. This is referred to as selection according to both z-coordinate and symmetry of electrical currents.

We assume that $A_1^1$ component is produced because of these results. However, this entails the components of m=1, n=5, 7, ... and m=5, 7, 9, ..., (n−m)=0, 2, 4, ...

Because of the construction described thus far, the correcting machine described in the above-cited U.S. Pat. No. 3,287,630 can correct rotation direction magnetic field components.

The present invention is characterized in that the concept of the matrix shim is utilized for correction of rotation direction magnetic field components. It is not easy to design a matrix shim for correcting rotation direction magnetic field components, for the following reason. The center angle and the aperture angle of the arcuate coil portions affect the rotation direction magnetic field components via triangular functions. As a consequence, it is difficult to select these factors.

In the aforementioned correction of axial magnetic field components, one degree of freedom is given to the arrangement of the shim coil. Also, one degree of freedom is given to the shape. In correction of rotation direction magnetic field components, coils are positioned on a cylindrical surface and so there exist two degrees of freedom. On the other hand, the shape and arrangement of coils are not self-evident. Furthermore, the number of coils is increased greatly. Consequently, each individual coil must be prevented from becoming complex in structure. In this way, a constraint is imposed.

One method of circumventing these problems and constraint consists of producing a rotation-symmetric magnetic field using the methods I–III of selecting a series shim.

In this case, the method IV of selection according to both z-coordinate and symmetry of electrical current is not used. More specifically, a matrix is created from only the components of $A_n^m$ or $B_n^m$ at Eqs. (12)–(14) having the same m. However, the $a_r$, $\Theta_r$, $\phi_r$ are made constant among the coils used in the same matrix.

Taking $A_n^1$ component as an example, $N_1$ coils defined by the following Eq. (27) are arranged in the z-direction, $$(z_r, a_r, \Theta_r, \psi_r, d_r, i) = \begin{array}{l}(z_{r0}, a_{r0}, 0, \pi/3, d_{r0}, i_0) \text{ (first portion)} \\ (z_{r0}, a_{r0}, \pi, \pi/3, d_{r0}, -i_0) \text{ (second portion)}\end{array} \quad (27)$$

Figure 1A:
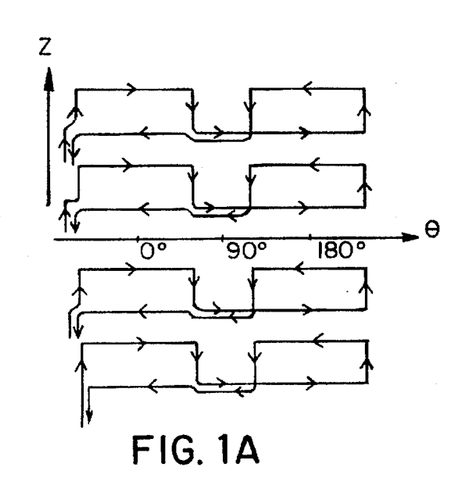
FIGS. 1A and 1B are developed diagrams illustrating structures of matrix shims for correcting rotation direction magnetic field components in accordance with the present invention.

$N_1$ coils are connected in series in the z-direction so that electrical currents flow clockwise and counterclockwise, respectively. Of course, coils in different series combinations may have different values of $d_{r0}$. The arrangement of the coils is shown in FIG. 1A, which is a developed view obtained by developing the coils in the direction of $\Theta$. In this figure, $N_1=4$. It is to be noted that neither power supplies nor control unit are shown. In practice, however, power supplies are connected with the coils, respectively. The control unit informs the power supplies of the electrical currents to be supplied to their respective coils in the same way as in FIG. 8B. The same principle applies to the following discussion.

This coil assembly produces only the components $A_n^1$ (n=1, 2, 3, ...) for the above-described reason. In the same way as in the above-described correction of axial magnetic field components, coils are arranged while selecting appropriate $z_r$ and $d_r$. Then, a matrix is found. Electrical currents to be supplied to the coils are determined from its inverse matrix.

$$c = Fi \quad (28)$$

$$c = [c_k] \quad (29)$$

$$F = [f_{kl}] \quad (30)$$

$$i = [i_l] \quad (31)$$

where $c_k$ is the sum of the controlled magnetic field components of $A_{k+1}^1$ of all the coils, $f_{kl}$ is the controlled magnetic field component of the $A_{k+1}^1$ of the l-th coil, if is the current flowing through the l-th coil, and $$k=0, 1, 2, \ldots, (N_1-1)$$

$$l=0, 1, 2, \ldots, (N_1-1)$$

$N_1$ indicates the number of coils producing the $A_n^1$ components. If the coil producing the $A_n^1$ components is rotated through 90 degrees, then a coil producing $B^n_1$ is obtained.

Figure 1B:
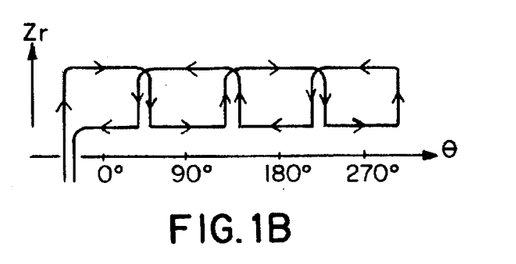

With respect to $A_n^2$ components, coils given by $$(z_r, a_r, \Theta_r, \psi_r, d_r, i) = \begin{array}{l}(z_{r0}, a_{r0}, 0, \pi/4, d_{r0}, i_0) \text{ (first portion)} \\ (z_{r0}, a_{r0}, \pi/2, \pi/4, d_{r0}, -i_0) \text{ (second portion)} \\ (z_{r0}, a_{r0}, \pi, \pi/4, d_{r0}, i_0) \text{ (third portion)} \\ (z_{r0}, a_{r0}, 3\pi/2, \pi/4, d_{r0}, -i_0) \text{ (fourth portion)}\end{array} \quad (32)$$

are distributed along the z-axis. The arrangement of the coils is shown in FIG. 1B, which is an expanded view obtained by expanding one coil in the direction of $\Theta$. Only the fundamental shape of the coil satisfying Eq. (32) is shown. In practice, plural coils of the structure shown in FIG. 1B are disposed along the z-axis in the same way as in FIG. 1A. Shim coils with m=3, 4, ... can similarly be constructed.

(C) Correction 2 of Rotation Direction Magnetic Field Components

Correction of rotation direction magnetic field components which minimizes the amount of heat generated is next described. Rotation direction magnetic field components can be corrected, using a matrix shim with the configuration described in the item (B) above. Because the methods I–III of selecting magnetic fields produced by a series shim are used, some problems arise.

For example, as can be easily understood from FIGS. 1A and 1B, the shape of the coil is complex, because corrective magnetic field components which are symmetrical with respect to a center of rotation are produced and selected according to the position and shape of the coil. As a result, a large amount of heat is generated. Also, numerous kinds of power supplies are necessary.

Figure 2A:
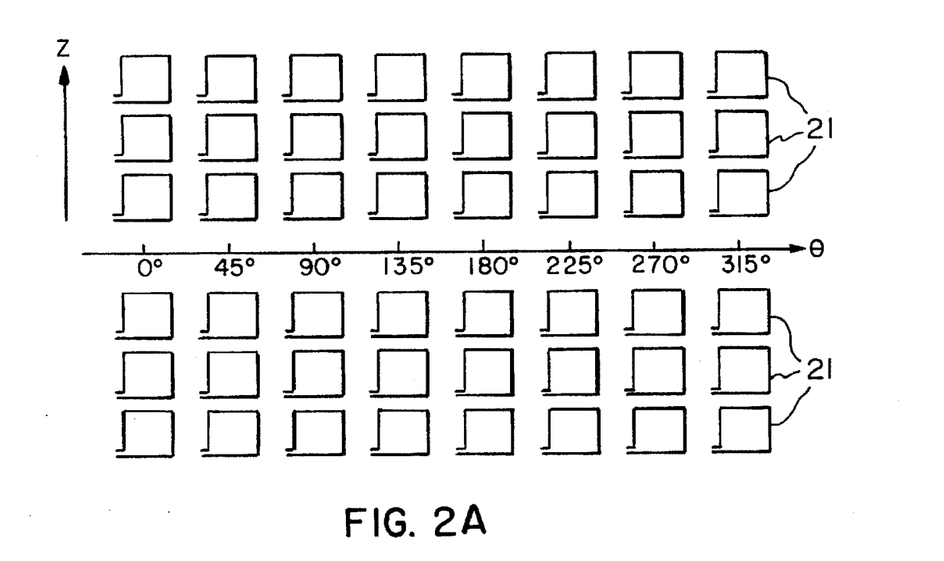
FIG. 2A is a developed view illustrating the coil arrangement in a Lagrangian shim for correcting rotation direction magnetic fields in accordance with the invention.
Figure 5:
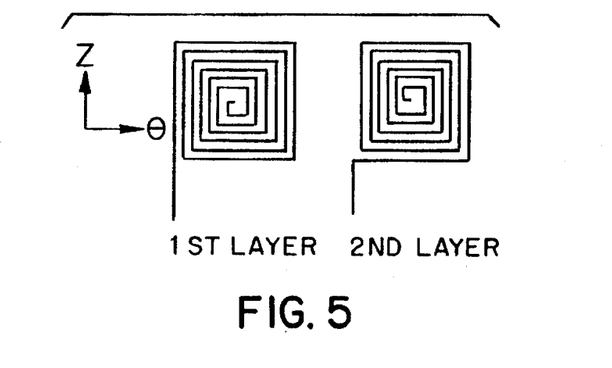
FIG. 5 is a developed diagram showing the configuration of other coils applicable to the invention.

We now discuss a desired coil position and shape while neglecting the relation of the number of coils to the controlled magnetic field components, the rotation symmetry of the magnetic field components produced by the coils, and other factors. Where the conditions (a)–(h) are taken into consideration, a preferred method consists of preparing spirally wound coils 21 as shown in FIG. 5 having the same shape, arranging the coils 21 symmetrically with respect to the z-axis, and stacking the coils on top of each other in the z-direction. In FIG. 2A, three stages of spirally wound coils 21 simplified as saddle-type coils are disposed on each side of the x-y plane. These coils are spaced 45° from each other on the same cylindrical plane. That is, 8 coils 31 exist per circumference. In total, 48 coils 31 are arranged symmetrically with respect to the x-y plane. The arrangement shown in FIG. 2A considerably differs from the prior art series shim.

Figure 2B:
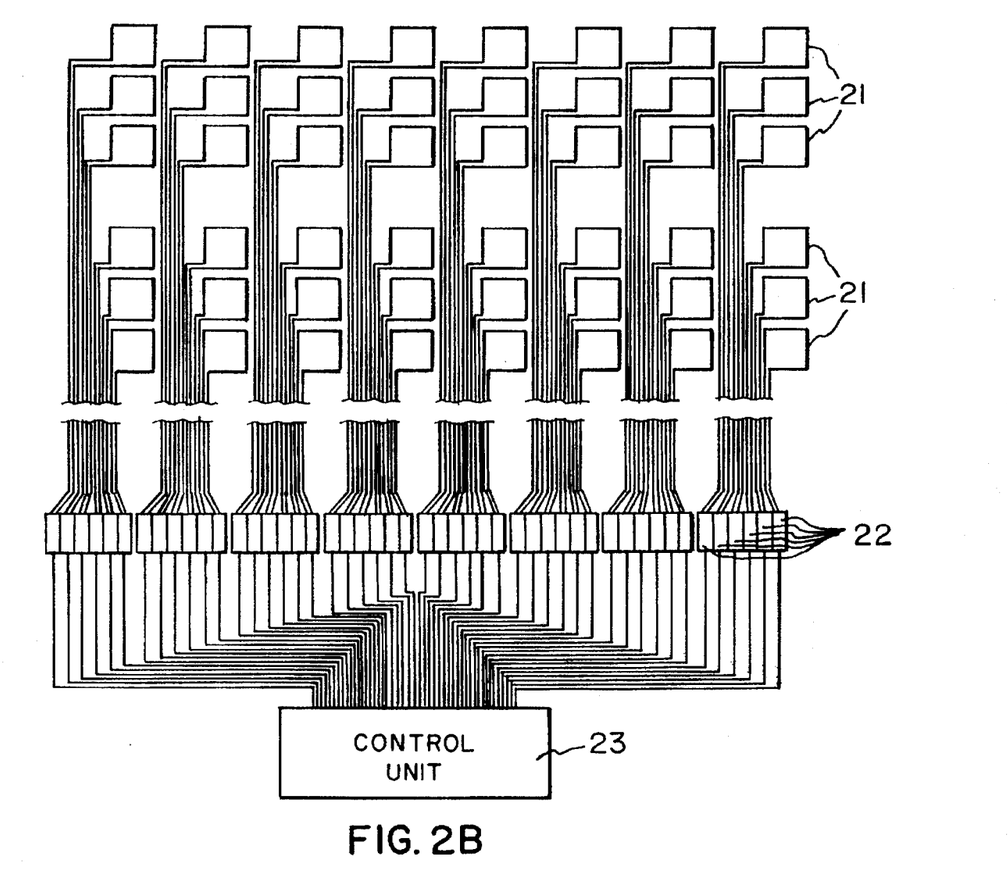
FIG. 2B is a view similar to FIG. 2A, but also showing leads.

In FIG. 2A, the positions of only the saddle-type coils 21 are shown. In practice, as shown in FIG. 2B, the saddle-type coils are connected with their respective power supplies 22 via leads. The control unit 23 informs the power supplies 22 of information about electrical currents to be supplied to the coils. These coils and leads can be easily formed on the surface of a flexible printed circuit board, for example, by patterning and etching techniques. The printed circuit board having the coils and the leads thereon is wound on a bobbin into a cylindrical form. Thus, the coil assembly of the corrective magnetic field-generating apparatus is completed.

The configuration shown in FIGS. 2A and 2B has a simple shape. Hence, the coils can be wound with little error. Also, the coils are wound with a narrower gap between them. Hence, the winding density can be enhanced. This reduces the amount of heat generated.

Moreover, each individual coil can be energized with only a small amount of electrical current, because a multiplicity of coils are used. In addition, the kinds of power supplies are made fewer because they are identical in shape. Since coils of the same construction and power supplies of the same kind are used in large quantities, a decrease in the cost by mass-production of effect can be expected. Where coils of the same shape are arranged so as to provide rotation symmetry, correction of magnetic field components are insusceptible to errors of coil positions and current value errors. If m of the $A_n^m$ and $B_n^m$ components assumes a large value, say 4 or 5, saddle-type coils as shown in FIGS. 2A and 2B can be easily placed in position.

Obviously, a spirally wound coil can be computed as an assemblage of currents flowing in saddle-shaped or arcuate paths. In this example, only a saddle-type coil is discussed for simplicity.

The present invention is further intended to construct a Lagrangian shim by creating a matrix from Eq. (11), the matrix acting to correct rotation direction magnetic field components in the same way as correction of axial magnetic field components. We now discuss a case in which saddle-type coils of the same shape are arranged symmetrically with respect to the z-axis as shown in FIGS. 2A and 2B. As can be seen from Eqs. (12)–(14), it is to be noted that the rotation symmetry affects the selection of magnetic field components in a complex manner due to the center angle θr.

Since electrical currents flowing in saddle-shaped paths can be treated as the sum of currents flowing in arcuate paths as described above, we now take notice of the currents flowing in arcuate paths. If arcuate coil portions of the same aperture angle are arranged on a cylindrical plane so as to provide rotation symmetry, then the z-coordinate $z_r$, the radius $a_r$, and the aperture angle $\psi_r$ are all the same for every arcuate coil portion. Therefore, these currents flowing in the arcuate paths are identical with each other in the terms $T_n$ $(Z_r, a_r)$ $\psi_r$ and $T_n^m$ $(Z_r, a_r)$ sin (m $\psi_r$) of Eq. (11). These currents differ in cos (m $\theta_r$) and sin (m $\theta_r$).

When a matrix is written under these conditions, it is necessary to select m of the $A_n^m$ and $B_n^m$ components while paying attention to the dependency either of the column vectors formed by the currents flowing in saddle-shaped paths or of row vectors of the magnetic field components.

We have confirmed that under these conditions, if the m of the $A_n^m$ and $B_n^m$ components is so selected that it assumes successively increasing values as given in Eq. (34) below, then good results are obtained. Where coils are arranged on a cylindrical plane so as to provide rotation symmetry, the number of the coil is not normally set to an odd number. Therefore, the number $N_d$ of the saddle-type coils having the same z-coordinate is set to an even number. We now assume $$\theta_r = (2\pi/N_a)k \ (k=0, \ldots, N_d-1) \quad (33)$$

In this case, selected components are components of m=0

$A_n^m$ components m=1, 2, . . . , $N_d/2$ (where m≠0)

$B_n^m$ components m=1, 2, . . . , $N_d/2-1$ (34)

It is to be noted that the $B_n^m$ components of m=$N_d/2$ cannot be corrected by coil arrangement with Nd-times-rotation-symmetry, because sin $(\theta_r \times N_d/2)=0$. Also note that the controlled magnetic field components include m=0, i.e., axial magnetic field components.

Where the number $N_d$ is odd, it is desirable to select m=0 and another value in the range of from m=1 to m=$[N_d/2]$, where $[N_d/2]$ is a Gaussian number.

With respect to n of the $A_n^m$ and $B_n^m$ components, the same number as the number $N_p$ of saddle-type coils stacked on top of each other in the z-direction are selected. If each saddle-type coil is expressed in terms of an assembly of arcuate coil portions, then a matrix shim of saddle-type coils can be constructed. In FIGS. 2A and 2B, $N_d$=8 and $N_p$=6. Therefore, examples of magnetic field components to be selected are $A_0$–$A_5$ $A_1^1$–$A_6^1$  $A_2^2$–$A_7^2$  $A_3^3$–$A_8^3$  $A_4^4$–$A_9^4$ $B_1^1$–$B_6^1$  $B_2^2$–$B_7^2$  $B_3^3$–$B_8^3$ Preferably, $N_c$ annular coils for producing only axial field components are added to the matrix, as well as the saddle-type coils, for the following reason. If the axial field components and rotation direction field components are simultaneously corrected, then the number of degrees of freedom is increased compared with the case in which these two kinds of components are separately corrected. As a consequence, the amount of heat generated by the coils is reduced. In this case, with respect to the magnetic field components to be selected, the number of the components with m≠0 remains unchanged but the number of the components with m=0 increases. As a result, the number of the components to be selected is $N_c+N_p$.

If the relation $N_c$=10 is established, then the total number of the coils $N_t$ $(=N_c+N_p\times N_d)$ is 58 in the example of FIGS. 2A and 2B (the components $A_0$–$A_{15}$ are selected). Therefore, when current values supplied to the coils are determined, as many as 58 magnetic field components must be controlled. If the number $N_d$ of the saddle-type coils having the same z-coordinate and the number $N_p$ of saddle-type coils stacked on top of each other in the z-direction are increased, then in some cases more than 100 magnetic field components must be controlled. Even in this case, magnetic field correction is possible. However, field components other than the components to be controlled are also controlled. This leads to unwanted increases in the electrical currents. Also undesired generation of heat is induced.

Accordingly, it may be contemplated to reduce the controlled magnetic field components. For this purpose, essential components are selected from the components of Eq. (34), and conditions which minimize the amount of heat Q generated by the shim (i.e., similar to Eq. (20)) are used in the same way as in the case of axial magnetic field components. These are summarized as follows:

$$c=Fi \quad (35)$$

$$Q={}^tiRi \quad (36)$$

$$c=[c_k] \quad (37)$$

$$F=[f_{kl}] \quad (38)$$

$$i=[i_l] \quad (39)$$

$$R=[R_{ll}] \quad (40)$$

where ${}^ti$ is a transpose of i, $R_{ll}$ is the resistance of the l-th coil, $c_k$ is the sum of the controlled magnetic field components of $A_n^m$ or $B_n^m$ of all of the coils $f_{kl}$ is the controlled magnetic field components of $A_n^m$ or $B_n^m$ of the l-th coil, and if is the current flowing through the l-th coil. Also, we have relations $k=0, 1, 2, \ldots, (n_a-1)$ $l=0, 1, 2, \ldots, (N_t-1)$ where $N_t$ is the total number of coils and $n_a$ is the total number of controlled magnetic field components ($n_a \leq N_t$).

Thus, finding solutions by the Lagrangian multipliers gives rise to the same result as obtained with Eq. (25). That is, $$i = {}_v(R)\ {}^tF\ inv\ (F\ inv\ (R)\ {}^tF)\ c \tag{25}$$

Of course, this calculation is performed by the control unit. At this time, k's of the $c_k$ and $f_{kl}$ are ordered in such a way that the controlled magnetic field components of $A_n^m$ or $B_n^m$ are appropriately ordered and that both kinds of data agree in order. Also, l's of the $f_{kl}$, $i_l$, and $R_{ll}$ are so set that the annular coils and saddle-type coils are appropriately identically ordered. The same principle applies to the following description.

Eq. (35) holds only for saddle-type coils and so solutions can be found. It follows that four kinds of shims consisting of two matrix shims with $N_c=0$ and $N_c\ne 0$, respectively and two Lagrangian shims with $N_c=0$ and $N_c\ne 0$, respectively, are constructed from saddle-type coils having a simple shape. These shims are capable of compensating for rotation direction magnetic field components.

(D) Correction 3 of Rotation Direction Magnetic Field Components

As described in item (C) above, the Lagrangian shims capable of providing corrections of rotation direction magnetic field components can be constructed. We now discuss the case in which the number of coils is apparently made equal to the number of controlled magnetic field components.

We consider that the electrical current given by Eq. (35) is composed of $n_v$ virtual electrical currents $_vi$. Then, i and $_vi$ are interrelated by Eq. (41) below. A shim constructed in this way is referred to as a virtual current shim herein. In this case, the following relations hold:

$$i = U\,_vi \tag{41}$$

$$_vi = U\ inv\ (FU)\ c \tag{42}$$

$$c = Fi \tag{43}$$

$$i = [i_l] \tag{44}$$

$$_vi = [_vi_j] \tag{45}$$

$$U = [u_{lj}] \tag{46}$$

$$F = [f_{kl}] \tag{47}$$

$$c = [c_k] \tag{48}$$

where $i_l$ is the current flowing through the l-th coil, $_vi_j$ is the j-th virtual current, $u_{lj}$ is a matrix component for replacing a virtual current by an actual current, $f_{kl}$ are controlled magnetic field components of $A_n^m$ or $B_n^m$ of the l-th coil, and $c_k$ is the sum of the controlled magnetic field components of $A_n^m$ and $B_n^m$ of all the coils. Also, we have the following relationships:

$$k = 0, 1, 2, \ldots, (n_a - 1)$$

$$l = 0, 1, 2, \ldots, (N_l - 1)$$

$$j = 0, 1, 2, \ldots, (n_v - 1)$$

In this example, U is so set that the inverse matrix of Eq. (42) can be calculated. Suppose a shim as shown in FIGS. 2A and 2B. The conditions given by Eq. (34) are taken into account. As can be seen from Eq. (41), the virtual current $_vi$ can be expressed in terms of a linear combination of actual currents i's. Since U can be set at will, the virtual current $_vi$ can be set arbitrarily.

Take the shim shown in FIGS. 2A and 2B as an example. Corrections of $A_n^1$, $A_n^2$, $B_n^1$, and $B_n^2$ (where n = m to m+5, m=1, 2) are discussed. It is assumed that a combination of currents exists only between saddle-type coils providing rotation symmetry. At this time, U is a matrix consisting of 48 rows and 24 columns and can be separated into matrices consisting of elements composed of partial matrices $U_0$–$U_5$ only between coils providing rotation symmetry. It is assumed that every value of $U_k$ is identical. At this time we have $$U = \begin{bmatrix} U_0 & & & & & \\ & U_1 & & & 0 & \\ & & U_2 & & & \\ & & & U_3 & & \\ & 0 & & & U_4 & \\ & & & & & U_5 \end{bmatrix} \tag{49}$$

The following relationships can be established:

$$U_k = [u_{l'j'}]$$

$$k = 0, 1, 2, 3, 4, 5$$

$$l' = 0, 1, 2, \ldots, 7$$

$$j' = 0, 1, 2, 3 \tag{50}$$

If Eqs. (49) and (50) are substituted into Eq. (42), then the current i can be determined.

Figure 3:
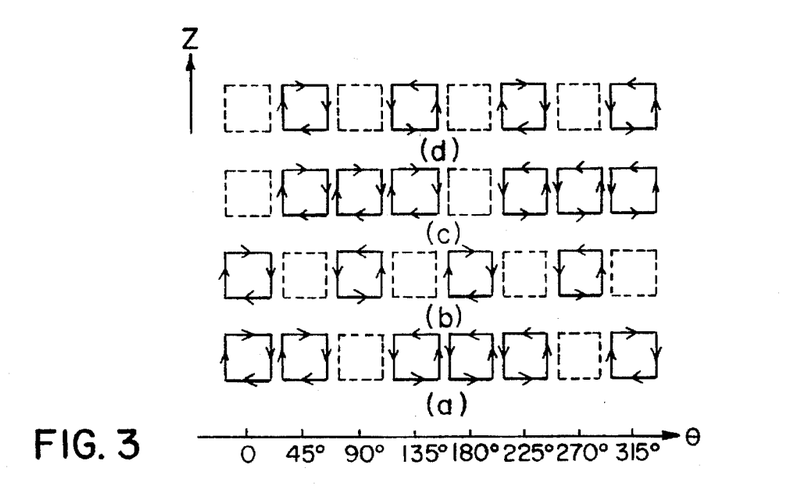
FIG. 3 is a developed diagram illustrating the structure of other virtual shims for correcting rotation direction magnetic fields in accordance with the invention.

An example of the coil shown in FIGS. 2A and 2B which produces virtual currents that generate the components $A_n^1$, $A_n^2$, $B_n^1$, and $B_n^2$ of Eq. (41) is shown in FIG. 3, where saddle-type coils are used for simplicity. Coils at the same z-coordinate are selected and shown.

In FIG. 3, (a) indicates the $A_n^1$ components, (b) indicates the $A_n^2$ component, (c) indicates the $B_n^1$ component, and (d) indicates the $B_n^2$ component. It is assumed that the coils indicated by the dotted lines are not energized, and that virtual dc currents of the same magnitude flow through every coil indicated by the solid lines in the directions indicated by the arrows. Actual currents are the sums of these virtual currents. It is easy to determine $U_k$ from FIG. 3.

Virtual currents flowing through the coils at other z-coordinates have similar relations except that currents show different values and different senses at each different z-coordinate. Generally, it is not necessary that the components of the matrix U be integers. They can be real numbers determined, using trigonometrical functions or other functions.

Only saddle-type coils have been described thus far. Of course, it is possible to construct a virtual current shim from annular coils.

(E) Shape and Arrangement of Coils

Figure 4:
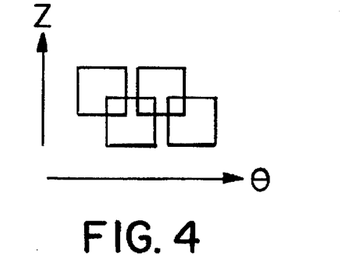
FIG. 4 is a developed diagram showing the configuration of coils applicable to the invention.

Matrix shims and Lagrangian shims according to the present invention have been described thus far. The shapes and arrangement of the coils are described now. Where rotation symmetry is taken into consideration, the arrangement of saddle-type coils or spiral coils is not limited to the configuration shown in FIGS. 2A and 2B. For example, as shown in the expanded view of FIG. 4, the coils may be made to overlap with each other in the z-direction and/or in the direction of rotation.

It is assumed that four saddle-type coils having an aperture angle of 45 degrees are located at the same z-coordinate and four-times-rotation-symmetrically arranged. If coils of a similar set are rotated through 45 degrees and made to overlap the aforementioned four saddle-type coils, then the resulting coil assembly can be treated as a shim with an eight-times-rotation-symmetry. Where saddle-type coils of different sizes are shifted from each other by 45 degrees and made to overlap each other, then a shim having two sets of coils with a four-times-rotation-symmetry can be constructed.

In FIGS. 2A and 2B, the coils at different z-coordinates have the same shape. In practice, the coil shape can be modified according to the z-coordinate.

The rotation symmetry of arrangement of saddle-type coils may be made different among coil assemblies having different z-coordinates. For example, coils located at some z-coordinate can assume center positions 0°, 90°, 180° and 270°. That is, these coils have a four-times-rotation-symmetry. Coils at difference z-coordinates can assume center angles 15°, 135°, and 255°, and thus have a three-times-rotation-symmetry.

The saddle-type coils shown in FIGS. 2A, 2B and 3 may be replaced with a spirally wound coil consisting of arcuate portions and straight line portions parallel to the z-axis as shown in FIG. 5. This coil consists of two vertically spaced layers. These layers are coupled to each other at their center positions. Also, in this case, this coil can be expressed as a combination of arcuate coil portions. Hence, the above-described method can be applied directly to this structure. The method can be similarly applied to a monolayer spiral coil and to spiral coils consisting of three or more layers.

Some of the coils shown in FIGS. 2A and 2B may be connected in series as one group and energized by one power supply. A Lagrangian shim can be constructed from plural groups of such coils. In this case, connections of coils differ according to the conditions. Restrictions are imposed neither on the shape such as the aperture angle of the coils nor on the positions, unlike the structure shown in FIG. 1.

The aforementioned "rotation symmetry on a cylindrical plane" is not limited to the case in which coils have exactly the same radius and they are exactly equally spaced from each other circumferentially. Rather, the "rotation symmetry" embraces cases in which coils have substantially the same radius and they are roughly equally spaced from each other circumferentially. Furthermore, in the above examples, the cylindrical plane is singular. The novel method can also be applied to cases where annular or arcuate coils exist on plural cylindrical planes having different radii.

Importantly, the configurations of matrix shims, Lagrangian shims, and virtual current shims described above do not define the shape and the positions of coils. That is, the present invention is also applicable to coils not exhibiting rotation symmetry and also to coils existing on cylindrical planes having different radii. Furthermore, the invention can be applied to coils of other shapes, as well as to annular coils and saddle-type coils. In the case of these coils, it may be necessary to use appropriate basic functions according to the conditions. However, they can be treated as matrices in exactly the same way as in the aforementioned method.

In the description provided thus far, information given to the control unit 3 shown in FIG. 6 relates to magnetic field components. However, information about magnetic field components can be found from information about magnetic field intensity values at space points within a space where magnetic field corrections are made, i.e., from information about the distribution of a magnetic field, by the least squares method or the like. Therefore, the information given to the control unit 3 may be information regarding the magnetic field distribution. In this case, the control unit 3 calculates information about the magnetic field components from the information about the magnetic field distribution.

While some preferred embodiments of the invention have been described, the invention is not limited thereto. Rather, they can be modified variously.

For example, in the description provided thus far, magnetic field components which determine currents supplied to shim coils are only magnetic field components $A_n^m$ and $B_n^m$ of Eq. (1) Physical quantities, such as magnetic fluxes created by coils, which become linear functions of electrical currents can be treated similarly to controlled magnetic field components.

With respect to the conditions of Eqs. (20) and (36) regarding Lagrangian shims, a method for minimizing ($a_k \times i_k^2 + b_k \times i_k + c_k$) may be conceivable. Furthermore, third or higher order of currents may be used as a limiting factor.

Where a virtual current shim contains more virtual currents than controlled magnetic field components, it is also possible to minimize the amount of heat generated by the shim. That is, it is a virtual-current Lagrangian shim.

Moreover, it may be contemplated to intentionally produce magnetic field components not used for correction by Eq. (35) so as to reduce the amount of heat generated by the coils. This is merely a modification of a Lagrangian shim.

In the above embodiments, Lagrangian multipliers, also known as undetermined multipliers, are used to find electrical currents which minimize the amount of heat generated. Instead, singular value decomposition can be employed.

The above-described discussion is not limited to expansion of Eq. (1) into functions. The same theory can be similarly applied to expansion, using other functions such as Bessel functions.

Although room-temperature shims have been described thus far, the present invention is not limited thereto. Rather, the invention can be applied to every kind of current shim.

Having this described our invention with the detail and particularity required by the Patent Laws, which is desired protected by Letters Patent is set forth in the following claims.

What is claimed is:

1. An apparatus for generating controlled magnetic field components in an instrument where a principal magnetic field is produced along a z-axis, said controlled magnetic field components acting to correct the magnetic field component directed along the z-axis, said apparatus comprising:

a plurality of coils placed on a cylindrical plane which is centered at the z-axis, said coils being more than said controlled magnetic field components;

power supplies for supplying electrical currents to said coils, respectively; and a control means for determining electrical currents supplied to said coils, depending on conditions of said controlled magnetic field components and also on other determined conditions, said power supplies acting to supply electrical currents determined by said control means to said coils, respectively.

2. The apparatus of claim 1, wherein said coils are solenoid coils wound around said z-axis on the cylindrical plane which is centered at said z-axis.

3. The apparatus of claim 2, wherein said solenoid coils are arranged symmetrically with respect to a reference position on said z-axis.

4. The apparatus of any one of claims 1 to 3, wherein said other determined conditions are conditions which minimize total amount of heat generated by said coils.

5. The apparatus of any one of claims 1 to 3, wherein said other determined conditions are conditions which assume each one virtual electrical current to flow through some of said coils such that an apparent number of said coils is equal to the number of said controlled magnetic field components.

6. The apparatus of any one or claims 1 to 2, wherein said control means assign arbitrary weights to said currents including actual currents and/or virtual currents supplied to said coils and determine said currents by Lagrangian multipliers.

7. An apparatus for generating controlled magnetic field components in an instrument where a principal magnetic field is produced along a z-axis, said controlled magnetic field components acting to correct the magnetic field component directed along said z-axis, said apparatus comprising:

a plurality of coils placed on a cylindrical plane which is centered at the z-axis, said coils acting to produce rotation-symmetric magnetic field components, said respective coils being contributable to corrections of plural rotation direction magnetic field components;

power supplies for supplying electrical currents to said coils, respectively; and a control means for determining electrical currents supplied to said coils according to conditions of said controlled magnetic field components, said power supplies acting to supply said electrical currents determined by said control means to said coils, respectively, wherein said coils are more than said controlled magnetic field components, and wherein said control means determines electrical currents supplied to said coils, depending on conditions of said controlled magnetic field components and also on other determined conditions.

8. The apparatus of claim 7, wherein said other determined conditions are conditions which minimize total amount of heat generated by said coils.

9. The apparatus of claim 7, wherein said other determined conditions are conditions which assume each one virtual electrical current to flow through some of said coils such that an apparent number of said coils is equal to the number of said controlled magnetic field components.

10. The apparatus of claim 7, wherein said control means assigns arbitrary weights to said currents including actual currents and/or virtual currents supplied to said coils and determine said currents by Lagrangian multipliers.

11. An apparatus for generating controlled magnetic field components in an instrument where a principal magnetic field is produced along a z-axis, said controlled magnetic field components acting to correct the magnetic field component directed along the z-axis, said apparatus comprising:

a plurality of coils placed on a cylindrical plane which is centered at the z-axis, said coils acting to produce rotation asymmetric magnetic field components, said coils being contributable to controls of rotation direction magnetic field components;

power supplies for supplying electrical currents to said coils, respectively; and a control means for determining electrical currents supplied to said coils according to conditions of said controlled magnetic field components, said power supplies acting to supply said electrical currents determined by said control means to said coils, respectively.

12. The apparatus of claim 11, wherein said conditions of said controlled magnetic field components are given as information about said magnetic field components to said control means.

13. The apparatus of claim 11, wherein said conditions of said controlled magnetic field components are given as information about a distribution of said magnetic field components to said control means.

14. The apparatus of any one of claims 11 to 18, wherein each of said coils consists of saddle-type or spiral coil portions connected in series.

15. The apparatus of any one of claims 11 to 18, wherein said coils are arranged about said z-axis so as to provide rotation symmetry.

16. The apparatus of any one of claims 11 to 18, wherein each of said coils contributes to corrections of both an axial magnetic field component and a rotation direction magnetic field component.

17. The apparatus of any one of claims 11 to 18, wherein said coils are more than said controlled magnetic field components, and wherein said control means determines electrical currents supplied to said coils, depending on conditions of said controlled magnetic field components and also on other determined conditions.

18. The apparatus of claim 17, wherein said other determined conditions are conditions which minimize total amount of heat generated by said coils.

19. The apparatus of claim 17, wherein said other determined conditions are conditions which assume each one virtual electrical current to flow through some of said coils such that an apparent number of said coils is equal to the number of said controlled magnetic field components.

20. The apparatus of claim 17, wherein said control means assigns arbitrary weights to said currents supplied to said coils and determines said currents by Lagrangian multipliers.

* * * * *

UNITED STATES PATENT AND TRADEMARK OFFICE
CERTIFICATE OF CORRECTION

PATENT NO : 5,661,401
DATED : August 26, 1997
INVENTOR(S) : Hiroshige Ishikawa and Jun Kida It is certified that error appears in the above-indentified patent and that said Letters Patent is hereby corrected as shown below Title Page, [57] ABSTRACT, Lines 16-17, between "field" and "components" delete hyphen (-)

Title Page, [73] Assignee, "Jeol Ltd " should read --JEOL Ltd --

Column 1 Line 17 "1 3" should read --1 0--

Column 1 Line 47 after "y-axes" delete --to--

Column 2 Line 13 "y-axes" should read --y-axis--

Column 5 Line 47 after "k≠0" delete --+tm--

Column 5 Line 47 move "(10')" to right margin

Column 6 Line 53 "$(z_r^2 + z_r^2)^{(n+2)}/2$" should read --$(z_r^2 + a_r^2)^{(n+2)/2}$--

Column 7 Line 57 "$\lceil R$" should read -- $\lceil R_{00}$--

Column 9 Line 15 "Let $\theta_r$ be the aperture angle" should read --Let $\psi_r$ be the aperture angle--

Column 9 Line 37, Eq (14), "$B_n^m (z_r, \theta_r, \psi_r)$" should read --$B_n^m (z_r, a_r, \theta_r, \psi_r)$--

Column 9 Line 48 after "$z_r$" insert period -- --

Column 10 Line 21 "$(z_r, z_r)$" should read --$(z_r, a_r)$--

Column 11 Line 49 "if is" should read --$i_l$ is--

Column 13 Line 53 "Nd-times" should read --$N_d$-times--

Column 14 Line 56 "if is" should read --$i_l$ is--

Column 15 Line 3, Eq (25), "i = in v" should read --i = inv--

Column 15 Line 9 "Also, f's" should read --Also, $l$'s--

UNITED STATES PATENT AND TRADEMARK OFFICE
CERTIFICATE OF CORRECTION

PATENT NO. : 5,661,401
DATED : August 26, 1997
INVENTOR(S) : Hiroshige Ishikawa and Jun Kida It is certified that error appears in the above-indentified patent and that said Letters Patent is hereby corrected as shown below:

Column 18 Line 13 between "Eq. (1)" and "Physical" insert --.--.

Claim 6 Column 19 Line 9 "any one or" should read --any one of--.

Claim 6 Column 19 Line 9 "claims 1 to 2" should read --claims 1 to 3--.

Claim 14 Column 20 Line 23 "of claims 11 to 18" should read --of claims 11 to 13--.

Claim 15 Column 20 Line 27 "of claims 11 to 18" should read --of claims 11 to 13--.

Claim 16 Column 20 Line 30 "of claims 11 to 18" should read --of claims 11 to 13--.

Claim 17 Column 20 Line 33 "of claims 11 to 18" should read --of claims 11 to 13--.

Signed and Sealed this

Third Day of February, 1998

BRUCE LEHMAN

Attest:

Attesting Officer

Commissioner of Patents and Trademarks